US012601973B2

(12) United States Patent
Kim et al.

(10) Patent No.: US 12,601,973 B2
(45) Date of Patent: Apr. 14, 2026

(54) SYSTEM FOR SUPPLYING PHOTORESIST AND METHOD FOR MANAGING PHOTORESIST

(71) Applicant: SEMES CO., LTD., Cheonan-si (KR)

(72) Inventors: Hae Kyung Kim, Cheonan-si (KR); Dae Sung Kim, Cheonan-si (KR); Woo Sin Jung, Cheonan-si (KR)

(73) Assignee: Semes Co., LTD., Cheonan-si (KR)

( * ) Notice: Subject to any disclaimer, the term of this patent is extended or adjusted under 35 U.S.C. 154(b) by 663 days.

(21) Appl. No.: 18/060,629

(22) Filed: Dec. 1, 2022

(65) Prior Publication Data

US 2023/0176482 A1 Jun. 8, 2023

(30) Foreign Application Priority Data

Dec. 2, 2021 (KR) ........................ 10-2021-0171320

(51) Int. Cl.
*G03F 7/16* (2006.01)
*B05C 11/10* (2006.01)

(52) U.S. Cl.
CPC ........... *G03F 7/16* (2013.01); *B05C 11/1013* (2013.01); *B05C 11/1026* (2013.01); *B05C 11/1036* (2013.01)

(58) Field of Classification Search
USPC .................. 118/683, 684, 692, 52, 612, 712
See application file for complete search history.

(56) References Cited

U.S. PATENT DOCUMENTS

2010/0283929 A1* 11/2010 Ahn ...................... G06Q 10/10
257/59

2015/0125793 A1* 5/2015 Yoshihara ......... H01L 21/67017
118/600

FOREIGN PATENT DOCUMENTS

| | | | |
|---|---|---|---|
| JP | 2010135535 A | 6/2010 | |
| JP | 2013191843 A | 9/2013 | |
| JP | 2017147369 A | 8/2017 | |
| KR | 10-20050013687 A | 2/2005 | |
| KR | 10-2006-0046127 A | 5/2006 | |
| KR | 10-20070012245 A | 1/2007 | |
| KR | 10-20070069976 A | 7/2007 | |
| KR | 10-2010-0030275 A | 3/2010 | |
| KR | 10-20120083859 A | 7/2012 | |

(Continued)

OTHER PUBLICATIONS

Japanese Office Action, dated Aug. 17, 2023, issued in corresponding Japanese Patent Application No. 2022-189138.

(Continued)

*Primary Examiner* — Yewebdar T Tadesse
(74) *Attorney, Agent, or Firm* — Harness, Dickey & Pierce, P.L.C.

(57) ABSTRACT

Provided is a system for supplying a photoresist. In an embodiment, a system for supplying a photoresist includes a pressure adjustment container provided to a supply line connected from a chemical liquid bottle to a first tank, and the pressure adjustment container includes a housing having a space formed therein, a separator separating the space of the housing into a first space and a second space, an inflow port making a photoresist flow in the first space, a discharge port discharging the photoresist from the first space, and a pressurized fluid inflow port supplying a pressurized fluid to the second space, and a volume of the first space varies depending on the supply of the pressurized fluid.

12 Claims, 8 Drawing Sheets

(56) References Cited

FOREIGN PATENT DOCUMENTS

| KR | 10-2015-0065590 | A | 6/2015 |
| KR | 10-2019-0139179 | A | 12/2019 |

OTHER PUBLICATIONS

Korean Office Action, dated Jul. 24, 2023, issued in Korean Patent Application No. 10-2021-0171320.

* cited by examiner

SYSTEM FOR SUPPLYING PHOTORESIST AND METHOD FOR MANAGING PHOTORESIST

CROSS-REFERENCE TO RELATED APPLICATIONS

This application claims priority to and the benefit of the Korean Patent Application No. 10-2021-0171320 filed in the Korean Intellectual Property Office on Dec. 2, 2021, the entire contents of which are incorporated herein by reference.

TECHNICAL FIELD

The present invention relates to a system for supplying a photoresist and a method for managing the photoresist in the system.

BACKGROUND ART

In a supply system of a photoresist, there is a head loss difference depending on a facility layout between a chemical liquid bottle storing the photoresist and a trap tank temporarily storing the photoresist. The head loss difference reaches up to 1540 mm. As a result, while negative pressure is formed in a supply system, there is a generation possibility of micro bubbles in a pipe.

Further, bubbles generated when replacing the chemical liquid bottle flow into up to the trap tank, and as a result, there is a problem in that bubbles that are discharged jointly with the photoresist influence pump and process performances.

SUMMARY OF THE INVENTION

An object of the present invention is to provide a system for supplying a photoresist and a method for managing a photoresist, which can minimize bubbles which can be generated in a photoresist supply system.

An object of the present invention is to provide a system for supplying a photoresist and a method for managing a photoresist, which can resolve negative pressure generated in a supply system due to a head loss difference.

An object of the present invention is to provide a system for supplying a photoresist and a method for managing a photoresist, which can effectively manage bubbles, in particular, in a high-viscosity photoresist.

The problem to be solved by the present invention is not limited to the above-mentioned problems, and the problems not mentioned will be clearly understood by those skilled in the art from the present specification and the accompanying drawings.

An embodiment of the present invention provides a system for supplying a photoresist. In an embodiment, a system for supplying a photoresist includes a pressure adjustment container provided to a supply line connected from a chemical liquid bottle to a first tank, and the pressure adjustment container includes a housing having a space formed therein, a separator separating the space of the housing into a first space and a second space, an inflow port making a photoresist flow in the first space, a discharge port discharging the photoresist from the first space, and a pressurized fluid inflow port supplying a pressurized fluid to the second space, and a volume of the first space varies depending on the supply of the pressurized fluid.

In an embodiment, the first tank may be positioned at a higher location than the chemical liquid bottle.

In an embodiment, the supply line may be connected to the higher location than the chemical liquid bottle.

In an embodiment, an opening/closing valve opening/closing a flow path may be provided on the upstream of the pressure adjustment container.

In an embodiment, a drain line may be connected to the supply line connecting the pressure adjustment container and the chemical liquid bottle in the supply line.

In an embodiment, the first tank may be a trap tank.

In an embodiment, the system may further include a controller, and the controller may control the pressurized fluid to be supplied to the second space to maintain the flow path formed by the supply line at a positive pressure when the photoresist is transmitted from the chemical liquid bottle to the first tank or the photoresist is not transmitted.

In an embodiment, the system may further include: an opening/closing valve provided on the upstream of the pressure adjustment container, and opening/closing a flow path in which the photoresist flows; and a controller, and the controller may control the first space to have a first volume when the photoresist is transmitted from the chemical liquid bottle to the first tank, and closes the opening/closing valve, and control the first space to have a second volume by controlling the supply of the pressurized fluid when the transmission of the photoresist from the chemical liquid bottle to the first tank is stopped, and the second volume may be larger than the first volume.

In an embodiment, the second volume may be a volume for maintaining the flow path formed by the supply line at the positive pressure.

In an embodiment, an air bubble sensor may be provided to the supply line connecting the pressure adjustment container and the chemical liquid bottle in the supply line.

In an embodiment, the system may further include: a drain line provided to the supply line connecting the pressure adjustment container and the chemical liquid bottle, and connected to the downstream of the air bubble sensor; and a controller collecting data from the air bubble sensor and opening/closing the drain line, and the controller may open the drain line when an air bubble sensed by the air bubble sensor is equal to or larger than a set value.

In an embodiment, the drain line may be closed when a sensing value of the air bubble sensor is equal to or smaller than the set value.

In an embodiment, the system ay further include: a bottle receiving container having an internal space formed therein, and having the chemical liquid bottle in the internal space; a pressurized gas inflow port connected to the internal space of the bottle receiving container and supplying pressurized gas to the internal space; and a supply pipe extended to the inside of the chemical liquid bottle and connected to the supply line.

Another embodiment of the present invention provides a system for supplying a photoresist, which includes: a container having an internal space formed therein, and having the chemical liquid bottle in the internal space; a pressurized gas inflow port connected to the internal space of the bottle receiving container and supplying the pressurized gas to the internal space; and a pipe extended to the inside of the chemical liquid bottle and discharging the photoresist stored in the chemical liquid bottle to the outside of the chemical liquid bottle.

Further, yet another embodiment of the present invention provides a method for managing a photoresist. In an embodiment, a method for managing a photoresist includes: in which in a supply line connected from a chemical liquid bottle to a first tank provided at a higher location than the chemical liquid bottle, a space includes a first space in which a photoresist flows and a second space separated from the first space by a separator, supplying a pressurized fluid in which the second space is filled to the second space; and changing a volume of the first space by supplying the pressurized fluid to maintain the photoresist inside the supply line at a positive pressure.

In an embodiment, an opening/closing valve opening/closing a flow path may be provided on the upstream of a pressure adjustment container.

In an embodiment, an air bubble sensor may be provided to a supply line connecting an area formed by the second space and the chemical liquid bottle in the supply line, a drain line may be connected to the upstream of the area which is the downstream of the air bubble sensor and is formed by the second space, and, and when a sensing value of the air bubble sensor is equal to or larger than a set value, the drain line may be opened.

In an embodiment, an opening/closing valve opening/closing a flow path may be provided on the upstream of the area formed by the second space, and when transmission of the photoresist from the chemical liquid bottle to the first tank is stopped, the opening/closing valve may be closed, and the pressurized fluid may be supplied to the second space to relatively decrease the volume of the first space.

In an embodiment, the inside of the supply line may become at a positive pressure by the decrease in volume of the first space.

In an embodiment, the first tank may be a trap tank.

According to an embodiment of the present invention, bubbles which can be generated in a photoresist supply system can be minimized.

According to an embodiment of the present invention, negative pressure generated in a supply system due to a head loss difference can be resolved.

According to an embodiment of the present invention, bubbles can be effectively managed, in particular, in a high-viscosity photoresist The effect of the present invention is not limited to the foregoing effects, and non-mentioned effects will be clearly understood by those skilled in the art from the present specification and the accompanying drawings.

DETAILED DESCRIPTION

Figure 1:
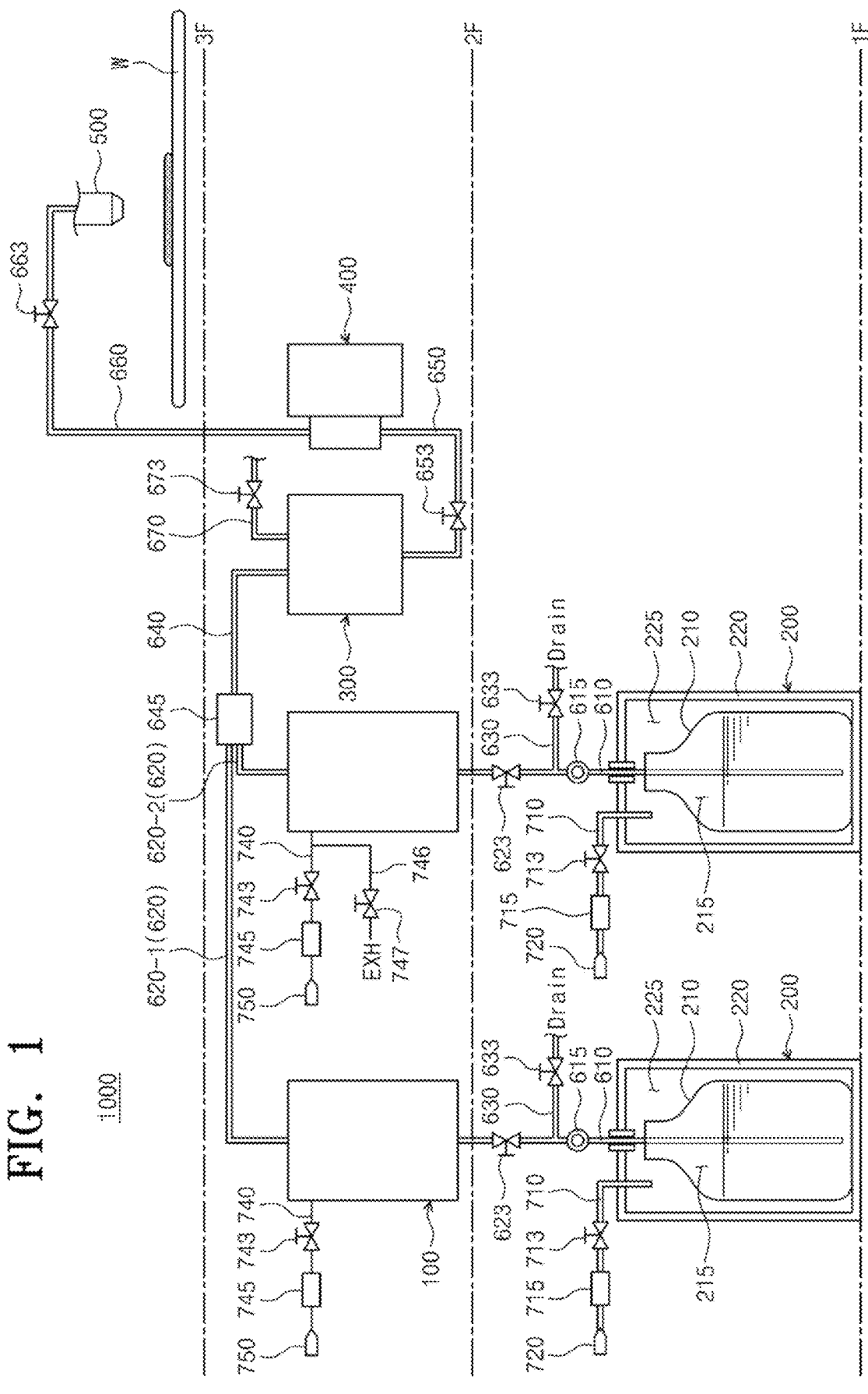
FIG. 1 illustrates a system for supplying a photoresist according to an embodiment of the present invention.

In the following detailed description, embodiments of the present invention have been shown and described, simply by way of illustration. As those skilled in the art would realize, the described embodiments may be modified in various different ways, all without departing from the spirit or scope of the present invention. Further, in describing the preferred embodiment of the present invention in detail, detailed description of associated known function or constitutions will be omitted if it is determined that they unnecessarily make the gist of the present invention unclear. Further, the same reference numeral is used for a part which performs a similar function and a similar action through all drawings.

Unless explicitly described to the contrary, the word "comprise" and variations such as "comprises" or "comprising", will be understood to imply the inclusion of stated elements but not the exclusion of any other elements. Specifically, it should be understood that term "include" or "have"indicates that a feature, a number, a step, an operation, a component, a part or the combination thereof described in the specification is present, but does not exclude a possibility of presence or addition of one or more other features, numbers, steps, operations, components, parts or combinations thereof, in advance.

A singular form includes a plural form if there is no clearly opposite meaning in the context. Further, shapes, sizes, and the like of elements in the drawings may be exaggerated for clearer explanation.

The term "and/or" includes any one of the corresponding listed items and all combinations of one or more items. Further, in this specification, the term "connected" means a case where member C is interposed between member A and member B to indirectly connect member A and member B in addition to a case where member A and member B are directly connected.

The embodiment of the present invention can be modified in various forms, and it should not be construed that the scope of the present invention is limited to embodiments described below. The embodiments are provided to more completely describe the present invention to those skilled in the art. Therefore, a shape of an element in the drawing is exaggerated in order to emphasizing a more definite description.

FIG. 1 illustrates a system for supplying a photoresist according to an embodiment of the present invention. The system for supplying a photoresist will be described with reference to FIG. 1.

The photoresist supplying system 1000 includes a chemical liquid bottle 210, a pressure adjustment container 100, a trap tank 300, and a pump 400.

The chemical liquid bottle 210 has an internal space. The photoresist is received and provided in the internal space 215 of the chemical liquid bottle 210. The chemical liquid bottle 210 is received and provided in a bottle receiving container 220. The bottle receiving container 220 provides a closed internal space 225, and the chemical liquid bottle 210 is received in the internal space 225. The internal space 215 of the chemical liquid bottle 210 is in communication with the internal space 225 of the bottle receiving container 220.

The internal space 225 of the bottle receiving container 220 is connected to a pressurized gas supply line 710. Pressurized gas is applied to the internal space 225 of the bottle receiving container 220 through the pressurized gas supply line 710. The applied pressurized gas raises the pressure of the internal space 225 to a predetermined pressure. The chemical liquid bottle 210 is connected to a first supply line 610. The chemical liquid bottle 210 is connected to the trap tank 300 through the first supply line 610, a second supply line 620, and a third supply line 640. The photoresist received in the chemical liquid bottle 210 is transferred through the first supply line 610 due to a relative pressure difference by the pressurized gas. In an embodiment, the pressurized gas may be nitrogen. As another example, the pressurized gas may be inactive gas.

As in the embodiment of the present invention, by a scheme of pressurizing the internal space 225 of the bottle receiving container 220, an inner pressure which may be applied increases three times compared with a scheme of directly pressurizing the internal space 215 of the chemical liquid bottle 210, and it is possible to shorten a charging time by using a high internal pressure.

The pressurized gas supply line 710 is connected to a pressurized gas supply source 720. A valve 713 and a regulator 715 are installed on the pressurized gas supply line 710. The valve 713 opens and closes a flow path formed by the pressurized gas supply line 710. The regulator 715 adjusts the pressure of the supplied pressurized gas to a set pressure.

The pressure adjustment container 100 is installed on the first supply line 610 connecting the trap tank 300 in the chemical liquid bottle 210.

Figure 2:
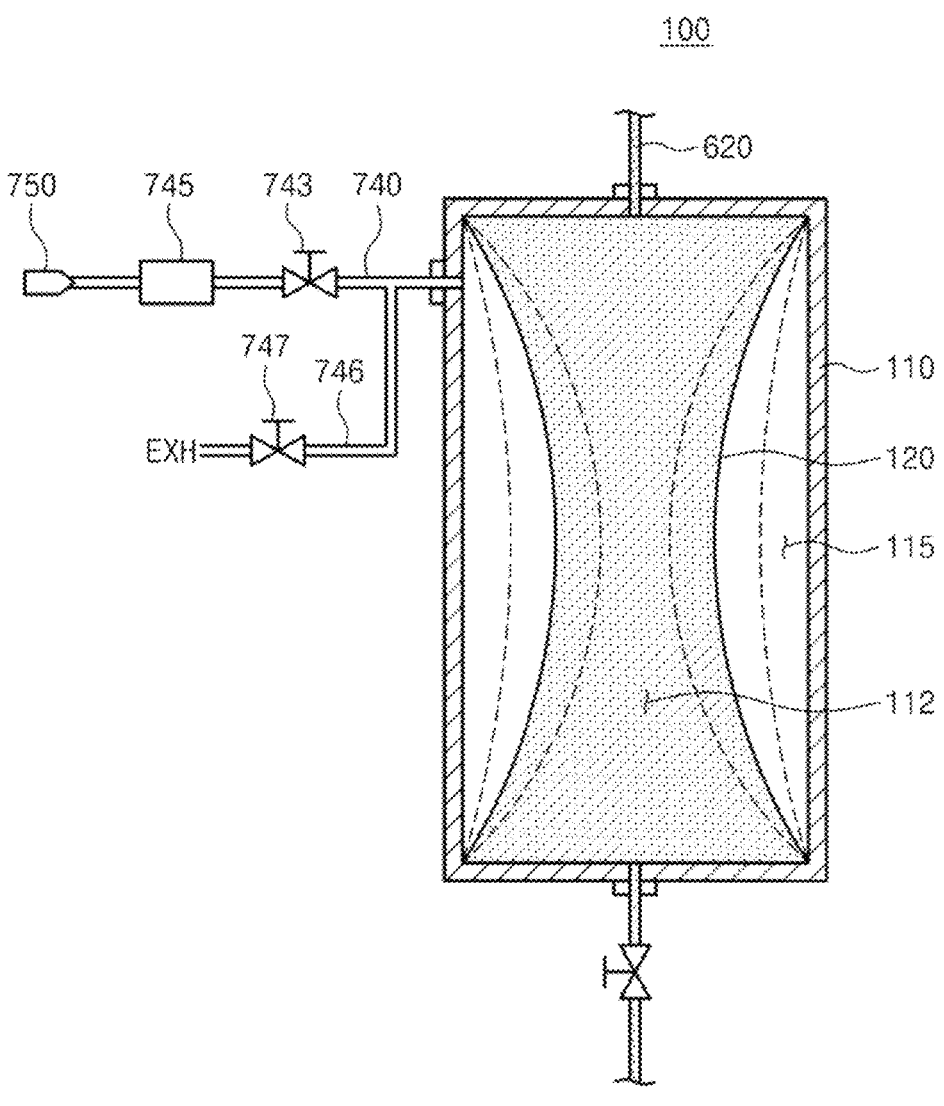
FIG. 2 is a cross-sectional view of a pressure adjustment container according to an embodiment of the present invention.

FIG. 2 is a cross-sectional view of a pressure adjustment container according to an embodiment of the present invention. An embodiment of the pressure adjustment container will be described with reference to FIG. 2.

The pressure adjustment container 100 includes a housing 110 and a separator 120. The housing 110 forms the internal space 215. The separator 120 separates the internal space 215 into a first space 112 and a second space 115. Since the first space 112 as a space in which the photoresist is transferred is a space connected to the first supply line 610 and the second supply line 620. The second space 115 is a space to which the pressurized gas is supplied and in which the pressurized gas is filled.

The separator 120 may be provided as a sheet of a flexible material. Further, the separator 120 is a material which is elastically deformed and of which area may be changed. The separator 120 may be corrosion resistant.

The second space 115 is connected to an inflow port connected to a pressurized fluid supply line 740. The inflow port is connected to the pressurized fluid supply line 740. The pressurized fluid supply line 740 is connected to a pressurized fluid supply source 750. A pressurized fluid may be nitrogen gas. However, although not limited thereto, the pressurized fluid may also be air. Further, the pressurized fluid is not limited gas, and may also be a liquid. A valve 743 and a regulator 745 are installed on the pressurized fluid supply line 740. The valve 743 opens and closes a flow path formed by the pressurized fluid supply line 740. The regulator 745 adjusts the pressure of the supplied pressurized fluid to a set pressure. The regulator 745 adjusts a supply pressure of the pressurized fluid to a pressure to maintain the photoresist which is present in a flow path formed by a supply line in which the pressure adjustment container 100 is connected to the trap tank 300 to the set pressure. For example, the pressure adjustment by the regulator 745 may be a pressure which maintains the pressure provided on the flow path formed by the supply line in which the pressure adjustment container 100 is connected to the trap tank 300 to a positive pressure. In another example, for example, the pressure adjustment by the regulator 745 may provide a fluid pressure sensor on the flow path formed by the supply line in which the pressure adjustment container 100 is connected to the trap tank 300, and may be feedback-controlled based on a measurement value of the fluid pressure sensor.

The second space 115 is connected to an exhaust line 746. In the exhaust line 746, a valve 747 that opens and closes a flow path formed by the exhaust line 746 is provided.

A volume of the first space 112 is changed according to the amount of the pressurized fluid supplied through the pressurized fluid supply line 740. When the amount of the pressurized fluid is large, the volume of the first space 112 decreases while the separator 120 is deformed. In a state in which the pressurized fluid is discharged from the second space 115, the volume of the first space 112 increases. Since the first space 112 is a part of the flow path in which the photoresist flows, when the volume of the first space 112 decreases, the photoresist is pressurized. The photoresist is pressurized to become the positive pressure. When the photoresist maintains the positive pressure, the negative pressure generated in the supply line due to the head loss difference between the chemical liquid bottle 210 and the trap tank 300 may be resolved and maintained to the positive pressure, so bubble generation by the negative pressure may be prevented.

The system for supplying a photoresist will be described by referring back to FIG. 1.

An air bubble sensor 615 is provided to the first supply line 610 connecting the pressure adjustment container 100 and the chemical liquid bottle 210. An air bubble sensor 615 is provided to the first supply line 630 connecting the pressure adjustment container 100 and the chemical liquid bottle 210. A drain line 630 is installed on the downstream of the air bubble sensor 615. A measurement value provided by the air bubble sensor 615 is delivered to a control unit (not illustrated). The control unit (not illustrated) opens a valve 633 to open the drain line 630 when an air bubble measured by the air bubble sensor 615 is equal to or larger than the measurement value. The control unit (not illustrated) closes the valve 633 to close the drain line 630 when the air bubble measured by the air bubble sensor 615 is equal to or smaller than the measurement value. Through application of the air bubble sensor 615 and the drain line 630, an air bubble contained in the first supply line 610 or the chemical liquid bottle 210 or an air bubble generated when replacing the chemical liquid bottle 210 may be removed.

The provided photoresist is temporarily stored in the trap tank 300. Water level sensors (not illustrated) are installed at one side of the trap tank 300 and sense a water level of the photoresist to continuously charge the photoresist at up to an appropriate water level. The trap tank 300 is positioned at a higher location than the chemical liquid bottle 210. For example, when the chemical liquid bottle 210 is provided to a first floor (1F) of equipment, the trap tank 300 may be provided to a second floor (2F) of the equipment.

The drain line 630 is connected to an upper end of the trap tank 300. The drain line 630 removes air bubbles gathered on the upper end of the trap tank 300. A fourth supply line 650 is connected to the trap tank 300. The fourth supply line 650 is connected to the inflow port of a pump 400.

The pump 400 supplies the photoresist stored in the trap tank 300 with a fixed amount by a flow pressure generated by suction and discharge operations. The pump 400 and a nozzle 500 are connected through a fifth supply line 660. The pump 400 suctions the photoresist for one wafer to a pump chamber (not illustrated) from the trap tank 300, and discharges the photoresist to the nozzle 500 at a constant pressure and at a constant flow rate upon application processing. In the embodiment, the pump 400 may be a liquid metering pump.

Figure 3:
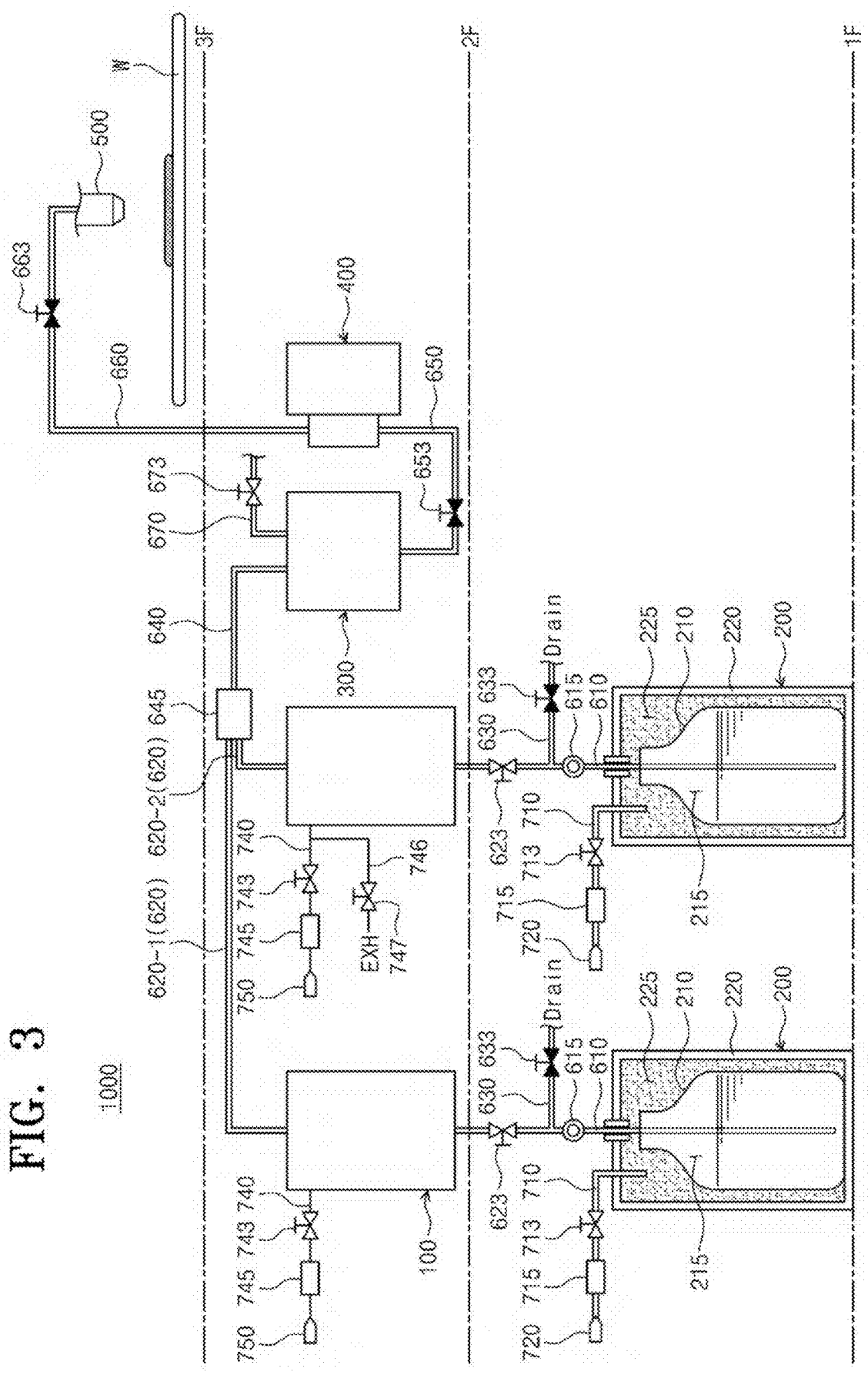
FIG. 3 is a diagram for describing a first aspect according to an operation of the system for supplying a photoresist according to an embodiment of the present invention.
Figure 4:
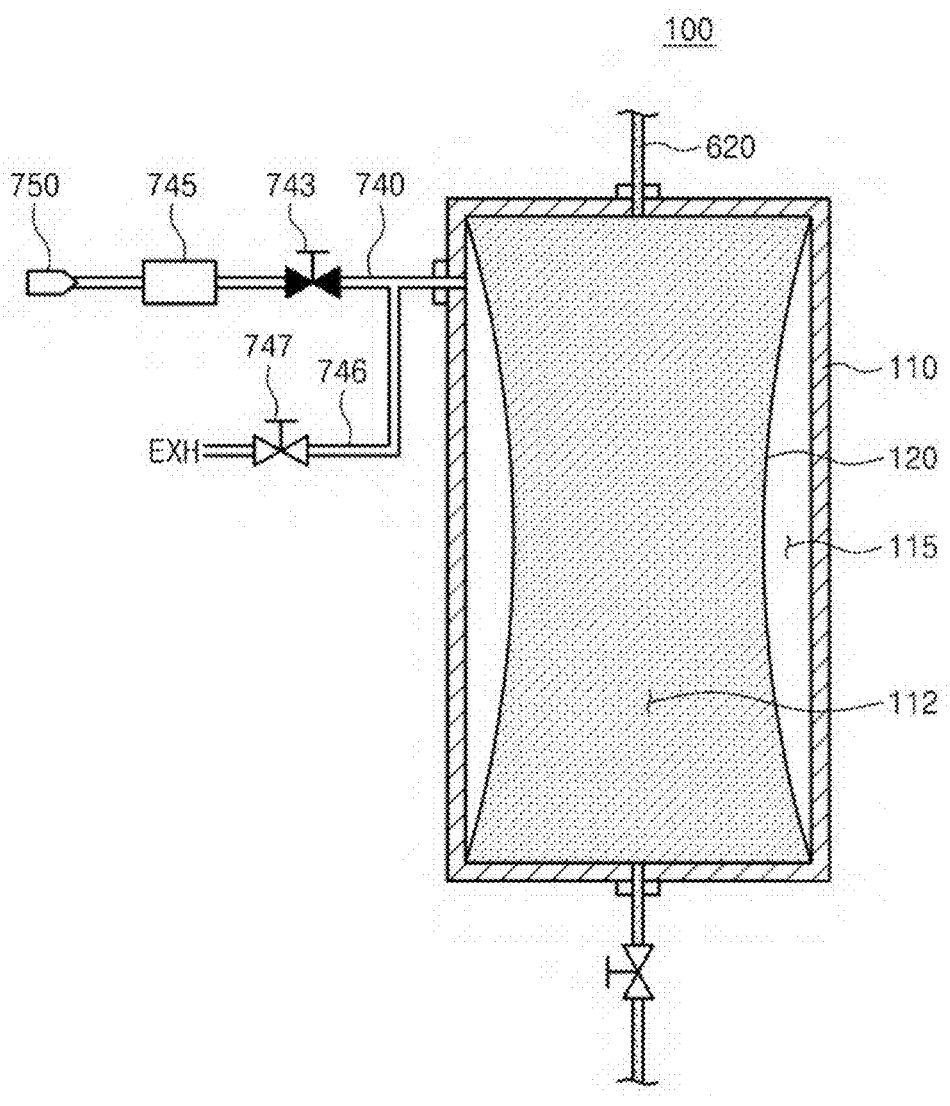
FIG. 4 is a diagram for describing an operation of the pressure adjustment container in a stage described in FIG. 3.
Figure 5:
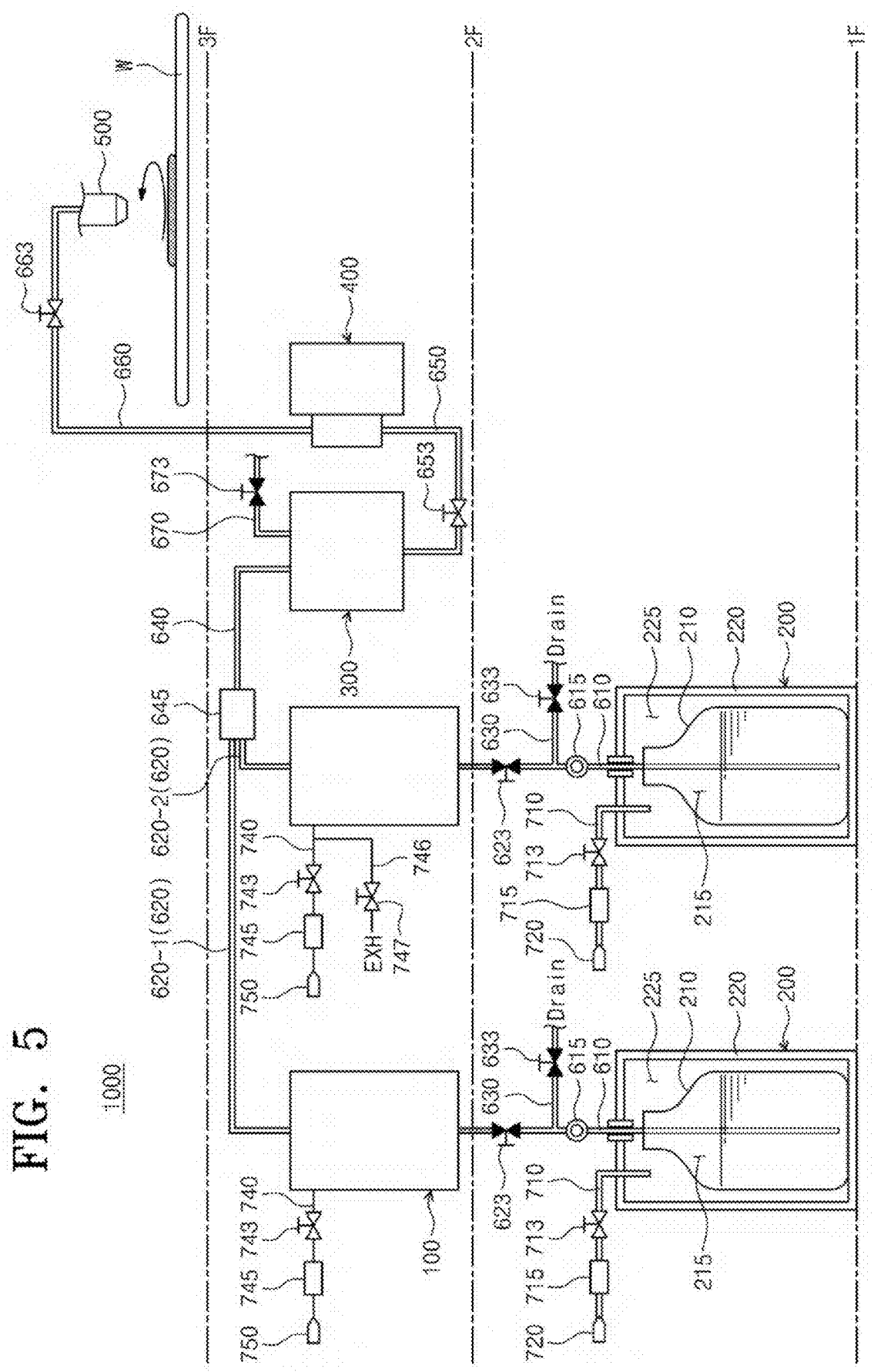
FIG. 5 is a diagram for describing a second aspect according to the operation of the system for supplying a photoresist according to an embodiment of the present invention.
Figure 6:
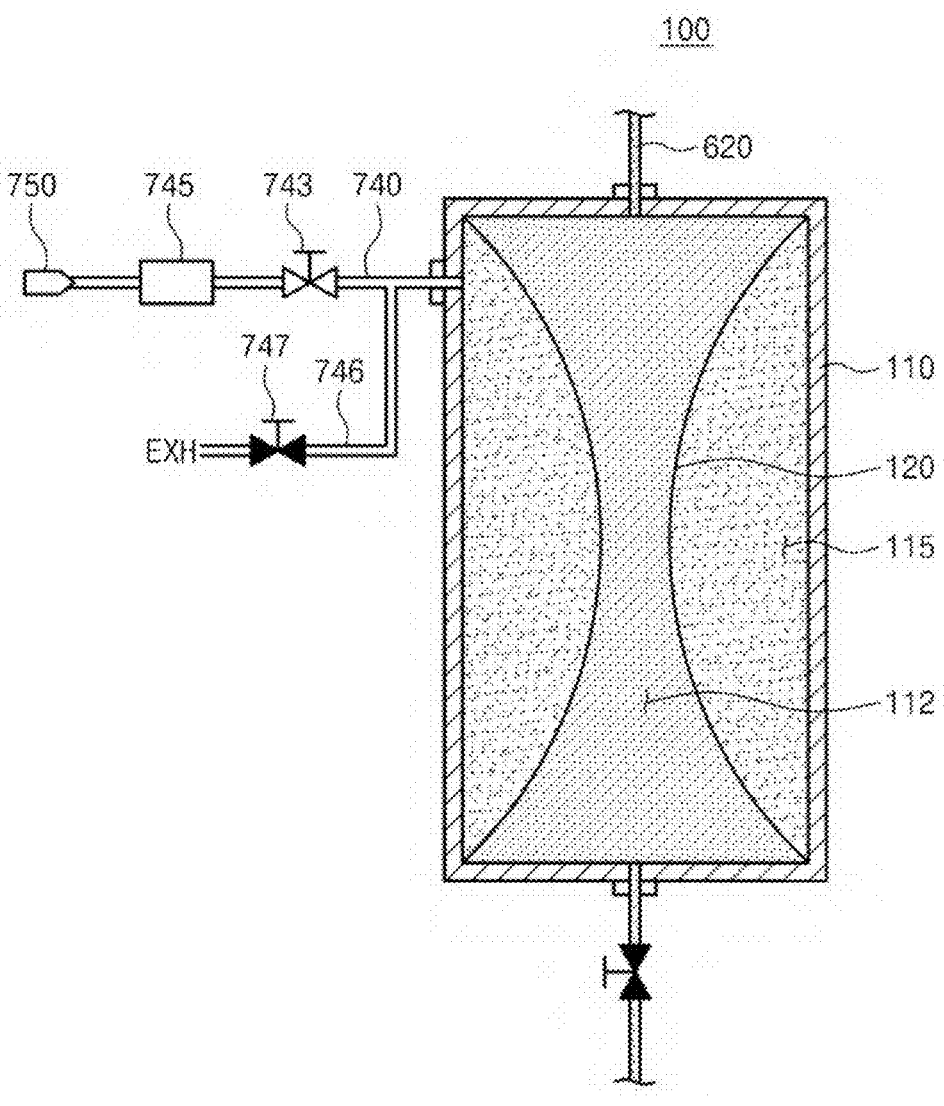
FIG. 6 is a diagram for sequentially describing the operation of the pressure adjustment container in a stage described in FIG. 5.
Figure 7:
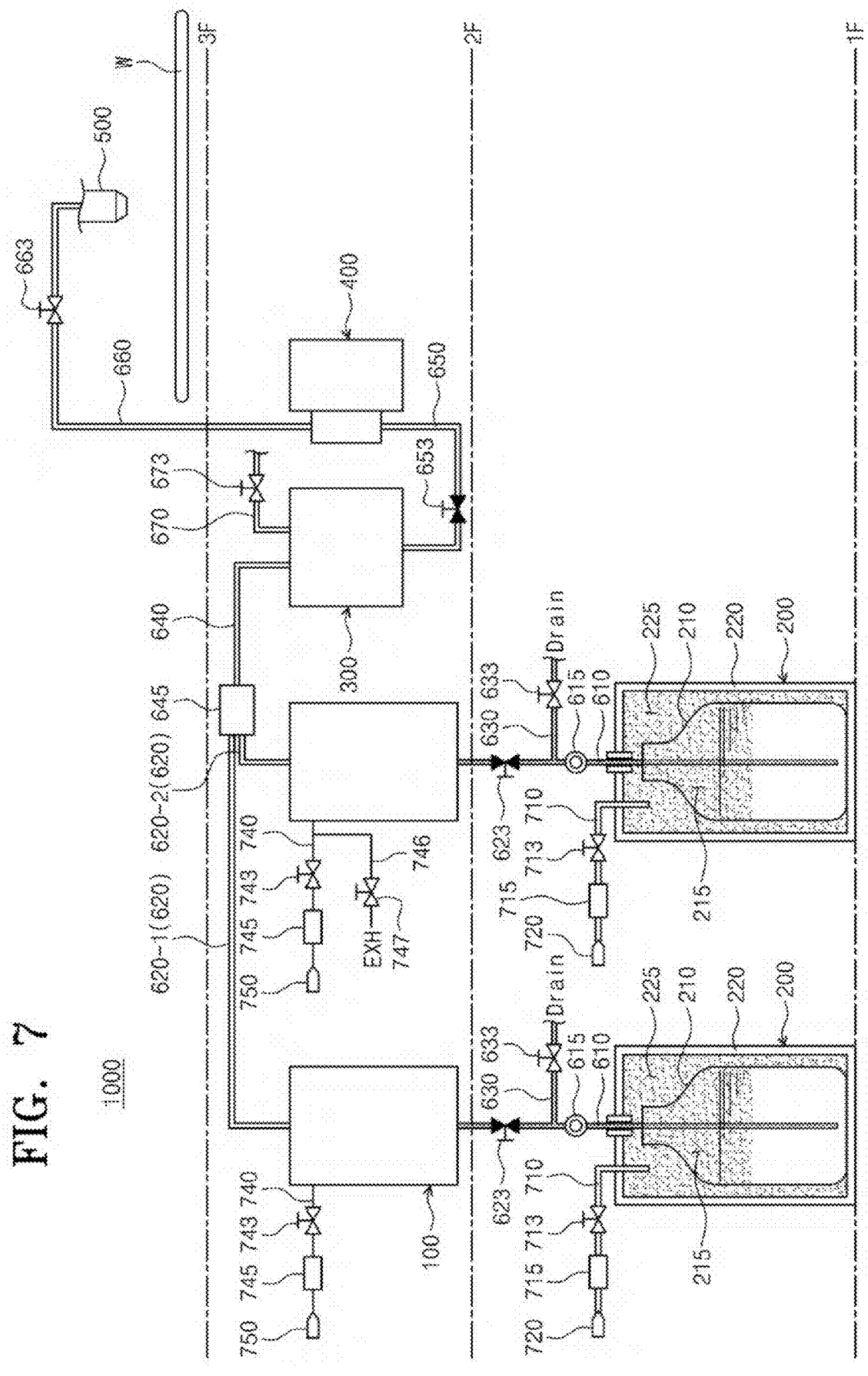
FIG. 7 is a diagram for describing a third aspect according to the operation of the system for supplying a photoresist according to an embodiment of the present invention.
Figure 8:
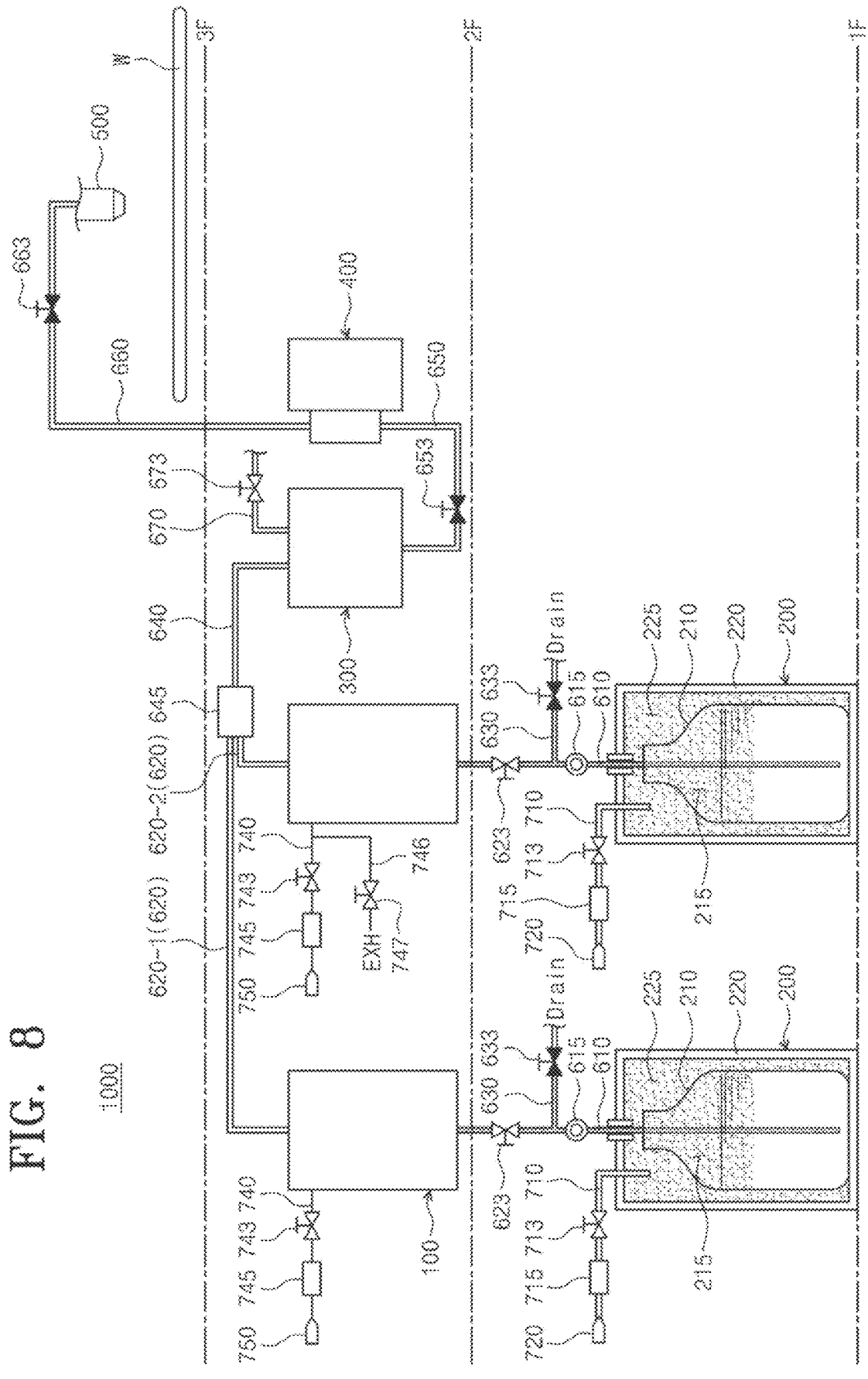
FIG. 8 is a diagram for describing a fourth aspect according to the operation of the system for supplying a photoresist according to an embodiment of the present invention.

FIG. 3 is a diagram for describing a first aspect according to an operation of the system for supplying a photoresist according to an embodiment of the present invention. FIG. 4 is a diagram for describing an operation of the pressure adjustment container in a stage described in FIG. 3. FIG. 5 is a diagram for describing a second aspect according to the operation of the system for supplying a photoresist according to an embodiment of the present invention. FIG. 6 is a diagram for describing the operation of the pressure adjustment container in a stage described in FIG. 5. FIG. 7 is a diagram for describing a third aspect according to the operation of the system for supplying a photoresist according to an embodiment of the present invention. FIG. 8 is a diagram for describing a fourth aspect according to the operation of the system for supplying a photoresist according to an embodiment of the present invention. An operating method of the photoresist supplying system according to an embodiment of the present invention will be described with reference to FIGS. 3 to 8. Prior to describing an embodiment to be described below, it is mentioned that the embodiment to be described below is just one example, but the present invention is not limited to the embodiment to be described below.

Referring to FIG. 3, when the pressurized gas is transferred to the internal space 215 through the pressurized gas supply line 710 to adjust the internal space 215 to a first pressure, the pressurized gas pressurizes the photoresist, and the pressurized photoresist is discharged along the first supply line 610 connected to a discharge port due to a relative difference of the pressure. The photoresist stored in the chemical liquid bottle 210 flows through the pressure adjustment container 100 along the first supply line 610. The photoresist passing through the pressure adjustment container 100 passes through the valve 645 through the second supply line 620, and is temporarily received in the trap tank 300 along the third supply line 640. The water level sensor (not illustrated) is provided to the trap tank 300. The photoresist is provided to the trap tank 300 until a reception amount of the photoresist sensed by the water level sensor (not illustrated) reaches a set water level. FIG. 4 is further referenced. In the state in which the photoresist is provided to the trap tank 300, the first space 112 of the pressure adjustment container 100 may have a first volume. The first volume may be a volume naturally formed when the photoresist flows in a state in which the pressurized fluid is not applied to the second space 115. When the reception amount of the photoresist sensed by the water level sensor (not illustrated) reaches the set water level, supplying the photoresist is stopped.

The supply stop of the photoresist transferred to the trap tank 300 may be performed by the valve 645. Further, the supply stop of the photoresist transferred to the trap tank 300 may be performed by stopping the supply of the pressurized gas supplied through the pressure gas supply line 710.

When the supply of the photoresist is stopped, the flow path o the supply line connecting the chemical liquid bottle 210 and the trap tank 300 may become at the negative pressure due to a location difference between the chemical liquid bottle 210 and the trap tank 300, i.e., the head loss difference. When the flow path becomes at the negative pressure, a fine bubble may be generated. FIGS. 5 and 6 are referenced. According to the embodiment of the present invention, when the supply of the photoresist is stopped, the valve 645 between the second supply line 620 and the third supply line 630 is in a lock state and the valve 623 of the first supply line 610 is in the lock state. In addition, the pressurized fluid is applied to the second space 115 of the pressure adjustment container 100. The volume of the first space 112 is adjusted to a second volume. The second volume is a volume is smaller than the first volume. When the first space 112 decreases to the second volume, the pressure of the flow path formed by the second supply line 620 which is the downstream of the valve 623 and the upstream of the valve 645 in the first supply line 610 may become the positive pressure. Therefore, the flow path of the supply line may become at the positive pressure in spite of the head loss difference of the chemical liquid bottle 210 and the trap tank 300, and the generation of the fine bubble may be prevented. Further, in order to maintain the flow path of the supply line at the positive pressure, the photoresist may not be pressurized by regularly supplying the pressurized gas through the pressurized gas supply line 710. When the photoresist is in a pressurized state by regularly supplying the pressurized gas, there is a possibility that the pressurized gas is met in the photoresist, which causes the fine bubble, but according to the embodiment, since non-contact type pressurization with the pressurized gas is performed, it is free from the problem of the fine bubble which may be generated by the pressurized gas for maintaining the supply line at the positive pressure.

FIG. 7 is referenced. According to an aspect of the present invention, a set amount of photoresist passing through the first supply line 610 may be discharged through the drain line 630. The air bubble sensor 615 measures the air bubble included in the photoresist. A controller may control the photoresist including the air bubble to be discharged through the drain line 630 when the air bubble measured by the air bubble sensor 615 is equal to or larger than the set amount. The air bubble may be generated when replacing the chemical liquid bottle 210, and there is a problem in that the generated bubble flows into the trap tank 300. When the photoresist including the air bubble is drained through the drain line 630, the problem may be resolved. FIG. 8 is referenced. The photoresist including the air bubble is drained, and when the air bubble measured by the air bubble sensor 615 is equal to or smaller than the set amount, the valve 630 is locked to stop the drain. In addition, the valve 623 and the valve 645 are opened to transmit the photoresist to the trap tank 300.

In the above-described embodiment, a higher-viscosity photoresist is used for high semiconductor integration. Bubble management is important in the high-viscosity photoresist, and the embodiment of the present invention may be more valid in the photoresist supplying system that transmits the high-viscosity photoresist.

The above-described controller not illustrated may control an overall operation of the substrate processing apparatus 1000. The controller (not illustrated) may include a central processing unit (CPU), a read only memory (ROM), and a random access memory (RAM). The CPU executes desired treating such as etching treating, etc., according to various recipes stored in storage areas of the CPU, the ROM, and the RAM.

Control information of an apparatus for a process condition is input into the recipe. Meanwhile, the programs or the recipe representing a treating condition may also be stored in a non-transitory computer-readable medium. The non-transitory computer-readable medium is not a medium that stores data therein for a while, such as a register, a cache, a memory, or the like, but means a medium that semi-permanently stores data therein and is readable by a computer. Specifically, various applications or programs described above may be stored and provided in the non-transitory computer readable medium such as a compact disk (CD), a digital versatile disk (DVD), a hard disk, a Blu-ray disk, a universal serial bus (USB), a memory card, a read only memory (ROM), or the like.

The foregoing detailed description illustrates the present invention. Further, the above content shows and describes preferred or various embodiments for implementing the technical spirit of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. Accordingly, the detailed description of the invention above is not intended to limit the invention to the disclosed embodiment. Further, the accompanying claims should be construed to include other embodiments as well. The modified embodiments should not be individually appreciated from the technical spirit or prospect of the present invention.

What is claimed is:

1. A system for supplying a photoresist, the system comprising:

a pressure adjustment container provided to a supply line connected from a chemical liquid bottle to a first tank, an opening/closing valve provided on an upstream of the pressure adjustment container, and opening/closing a flow path in which the photoresist flows; and a controller, wherein the pressure adjustment container includes a housing having a space formed therein, a separator separating the space of the housing into a first space and a second space, an inflow port making a photoresist flow in the first space, a discharge port discharging the photoresist from the first space, and a pressurized fluid inflow port supplying a pressurized fluid to the second space, and a volume of the first space varies depending on the supply of the pressurized fluid, wherein the controller when the photoresist is transmitted from the chemical liquid bottle to the first tank, controls the first space to have a first volume, and when the transmission of the photoresist from the chemical liquid bottle to the first tank is stopped, closes the opening/closing valve, and controls the first space to have a second volume by controlling the supply of the pressurized fluid, and the second volume is larger than the first volume.

2. The system of claim 1, wherein the first tank is positioned at a higher location than the chemical liquid bottle.

3. The system of claim 2, wherein the supply line is connected to the higher location than the chemical liquid bottle.

4. The system of claim 1, wherein an opening/closing valve opening/closing a flow path is provided on the upstream of the pressure adjustment container.

5. The system of claim 1, wherein a drain line is connected to the supply line connecting the pressure adjustment container and the chemical liquid bottle in the supply line.

6. The system of claim 1, wherein the first tank is a trap tank.

7. The system of claim 1, wherein the controller controls the pressurized fluid to be supplied to the second space to maintain a flow path formed by the supply line at a positive pressure when the photoresist is transmitted from the chemical liquid bottle to the first tank or the photoresist is not transmitted.

8. The system of claim 1, wherein the second volume is a volume for maintaining the flow path formed by the supply line at a positive pressure.

9. The system of claim 1, wherein an air bubble sensor is provided to the supply line connecting the pressure adjustment container and the chemical liquid bottle in the supply line.

10. The system of claim 9, further comprising:

a drain line provided to the supply line connecting the pressure adjustment container and the chemical liquid bottle, and connected to downstream of the air bubble sensor; and the controller collecting data from the air bubble sensor and opening/closing the drain line, wherein the controller opens the drain line when an air bubble sensed by the air bubble sensor is equal to or larger than a set value.

11. The system of claim 10, wherein the drain line is closed when a sensing value of the air bubble sensor is equal to or smaller than the set value.

12. The system of claim 1, further comprising:

a bottle receiving container having an internal space formed therein, and having the chemical liquid bottle in the internal space;

a pressurized gas inflow port connected to the internal space of the bottle receiving container and supplying pressurized gas to the internal space; and a supply pipe extended to an inside of the chemical liquid bottle and connected to the supply line.

* * * * *